United States Patent [19]

Geissler et al.

[11] 4,447,289

[45] May 8, 1984

[54] PROCESS FOR THE MANUFACTURE OF COARSELY CRYSTALLINE TO MONOCRYSTALLINE SHEETS OF SEMICONDUCTOR MATERIAL

[75] Inventors: Joachim Geissler, Stammham; Dieter Helmreich, Burghausen, both of Fed. Rep. of Germany

[73] Assignee: Heliotronic Forschungs-und Entwicklungsgesellschaft fur Solarzellen-Grundstoffe mbH, Burghausen, Fed. Rep. of Germany

[21] Appl. No.: 397,581

[22] Filed: Jul. 12, 1982

[30] Foreign Application Priority Data

Aug. 19, 1981 [DE] Fed. Rep. of Germany ....... 3132776

[51] Int. Cl.$^3$ ...................... C30B 11/02; C30B 15/12
[52] U.S. Cl. ........................... 156/608; 156/617 SP; 156/DIG. 97; 156/DIG. 64; 422/249; 136/261
[58] Field of Search ................. 156/608, 617 H, 622, 156/624, DIG. 64, DIG. 65, DIG. 88, DIG. 73, DIG. 97, 617 SP, 601; 422/249; 427/74, 86, 443.2; 423/348; 136/261

[56] References Cited

U.S. PATENT DOCUMENTS

| | | | |
|---|---|---|---|
| 4,113,548 | 9/1978 | Sigmund | 156/622 |
| 4,119,744 | 10/1978 | Brissot et al. | 427/86 |
| 4,233,338 | 11/1980 | Ricard et al. | 156/608 |
| 4,303,463 | 12/1981 | Cook | 156/DIG. 88 |
| 4,309,239 | 1/1982 | Fumeton | 422/249 |
| 4,366,024 | 12/1982 | Ast et al. | 423/348 |

OTHER PUBLICATIONS

A. G. Milnes et al., Peeled Film Technology for Solar Cells, IEEE Photovaltic Specialist Conference, 1975, pp. 338–341.
J. D. Heaps et al., Continuous Coating of Silicon–on–Ceramic, Photovaltic Specialist Conference, Jan. 7–10, 1980, pp. 39–48.
Z. A. Zoutendyk, Development of Low–Cost Silicon Crystal Growth Techniques for Terrestrial Photovaltic Solar Energy Conversion, International Solar Energy Society Conference "Sharing the Sun", Aug. 16–20, 1976, pp. 1–14.

*Primary Examiner*—David L. Lacey
*Attorney, Agent, or Firm*—Collard, Roe & Galgano

[57] ABSTRACT

The invention provides a process for the manufacture of coarsely crystalline to monocrystalline sheets and/or plates of semiconductor material of preferred orientation. A meniscus of molten semiconductor material comes in contact with a moving, cooler substrate of the same coarsely crystalline to monocrystalline semiconductor material, during which, while transferring the preferred orientation, a thin sheet of the semiconductor material is pulled onto the substrate and, after cooling, becomes detached from the substrate. The substrate can be reused as often as desired.

6 Claims, 2 Drawing Figures

PROCESS FOR THE MANUFACTURE OF COARSELY CRYSTALLINE TO MONOCRYSTALLINE SHEETS OF SEMICONDUCTOR MATERIAL

The present invention relates to a process for the manufacture of coarsely crystalline to monocrystalline sheets and/or plates of semiconductor material of preferred orientation. More particularly, it relates to such a process wherein molten semiconductor material is applied to a substrate of the same coarsely crystalline to monocrystalline semiconductor material and, after solidifying, becomes detached from the substrate as a result of thermal stress.

Solar cells, as used in space travel as current generators, are far too expensive to be used widely on earth. The main reason for their high cost is the manufacturing process, which requires a large amount of work and material, and according to which monocrystalline silicon rods or bars obtained by crucible-pulling or zone-pulling are sawn up, with a considerable loss of material, to form monocrystalline silicon wafers.

The avoidance of this expensive and very wasteful sawing step has been the aim of numerous processes which have become known in the meantime and in which attempts have been made to obtain silicon directly in plate or sheet form. This is effected, for example, by pulling a monocrystalline silicon band from a polycrystalline silicon supply rod via a shaping die. According to the EFG-process, (edge film-fed growth process), monocrystalline silicon is pulled off in an upward direction, in band form, for example via a shaping capillary body of carbon dipped into a silicon melt. According to Bleil's process, silicon is melted in a crucible and a silicon band is pulled off sideways by means of a seed crystal under the effect of a temperature gradient, the level of the melt in the crucible being kept constant by a system of displacement bodies dipped into the melt. Finally, according to Shockley's process, band-form silicon is obtained by melting a polycrystalline supply rod onto liquid lead and pulling the silicon horizontally, from the lead film, in the form of a band, by means of a seed crystal, and under the effect of a temperature gradient. The efficiency of the processes mentioned is, however, limited by the low pulling speeds, which are of the order of a few centimeters per minute. The last mentioned process is further complicated by the fact that the lead used as the substrate surface must be extremely pure so that the silicon which is melted and resolidified thereon is not contaminated. A further disadvantage is the high vapor pressure of the lead, the result of which is that lead is inevitably deposited on the silicon band at the cool end of the apparatus from which the resolidified silicon is pulled off. A comprehensive description of these and similar processes can be found in an article by Jean-Jaques Brissot, "Silicium pour photopiles solaires", *Acta Electronica*, 20, 2, 1977, pages 101 to 116.

The process according to DE-OS 29 03 061, according to which a silicon sheet is pulled from a melt embedded in a non-elemental slide melt, is technically difficult to carry out because of the necessary precise replacement and control of the slide melt, especially at the pull-off position. Above all, evaporation and the associated change in composition, aggravated by reactions between the crucible, the melt and the slide melt, can cause viscosity changes and thus constantly alter the sliding properties.

Finally, according to the process described in DE-OS 28 30 522, silicon bands can be obtained by applying liquid silicon to a rotating monocrystalline silicon support, the bands which have grown being centrifuged off the support with material being stripped off. In this process, the support has to be maintained at a high temperature just below the melting point of silicon; in addition, because of the loss of material, the support can be used only for a limited time and has to be replaced from time to time.

The problem of the invention was therefore to provide a process by means of which coarsely crystalline and monocrystalline semiconductor sheets can be manufactured at a high pulling speed with the aid of a substrate that can be reused as often as desired.

This problem is solved by a process which is characterized in that molten semiconductor material is brought into contact with a substrate of the same coarsely crystalline to monocrystalline semiconductor material which is guided past the point of contact at a speed of at least 75 mm/s, and in that, in order to ensure the automatic release of the growing sheet or plate, the substrate is maintained at a temperature of not more than $0.8\ T_M$, where $T_M$ denotes the melting point of the semiconductor material expressed in degrees Kelvin.

In this process, it has proved advantageous first to place the semiconductor material from which the sheet is to be produced, in a suitable form, for example in the form of a granulate in the case of silicon, into a melt-preparation vessel that is separate from the actual pulling system, and to melt it therein. The melt is then transferred via a connecting system. This can be carried out, for example, by means of an overflow system in conjunction with displacement bodies so that a uniform flow of the molten semiconductor material to the pulling system is ensured.

A one-component material, such as, for example, silicon or germanium, is preferably used as the semiconductor material for the purposes of the invention, although the invention can also be applied to multi-component semiconductor materials, such as, for example, III–V compounds, for example, indium phosphide, gallium phosphide or gallium arenside.

The pulling system contains the pulling crucible, which is made of graphite or, preferably, quartz. The molten semiconductor material, which has flowed from the melt-preparation vessel, is collected in the pulling crucible and adjusted to a temperature of up to 100° C., but preferably of from 5° to 50° C., above its melting point. The crucible can be heated, for example, by resistance heating or induction heating.

The melt and the substrate can be brought into contact with one another, for example, by pouring, centrifuging or spraying the melt onto the substrate. A further possibility is, for example, to so design one side of the pulling crucible so that the molten semiconductor material contained therein can be brought into contact with the substrate. To this end, it has proved to be especially advantageous to cause the molten semiconductor material to form a meniscus that projects beyond the edge of the crucible and is stabilized by surface tension. That can be achieved, for example, by simple control of the inclination of the crucible. It is, however, especially advantageous for one side of the pulling crucible to have a slot-like aperture-preferably at the level of the base of the crucible-of such dimensions that the molten semiconductor material can pass through it forming a meniscus. The formation of the meniscus is influenced, for example, by the melt temperature, the inclination of the crucible and the dimensions of the slot.

The height of the slot-like aperture depends on the required stability of the resulting meniscus, while the width of the slot depends on the desired width of the sheet. Particularly good results can be obtained when the width of the slot is from 1 to 20 mm, preferably 10 mm, greater than the width of the substrate.

The actual pulling of the sheet is carried out by bringing a substrate made of the same coarsely crystalline to monocrystalline semiconductor material into contact with the meniscus of molten semiconductor material and moving it past the meniscus at a speed of at least 75 mm/s. It has proved favorable for the free surface of the melt film pulled off at the contact position in that way to be maintained at the melt temperature by an additional heating device, for example an electron-beam device or a laser gun. In the course of this pulling operation, the preferred orientation of the substrate is imparted to the solidifying semiconductor material and thus coarsely crystalline to monocrystalline sheet is pulled onto the substrate, and that sheet then becomes detached, unaided, from the substrate as a result of thermal stress.

In the case of continuous operation, the substrate can be moved past the meniscus in the form of an "endless band" or a cylinder, for example. In the case of semicontinuous operation, it is also possible to use, as the substrate, individual ramps having a length of, for example, 1 m. The width of the particular substrate depends on the desired width of the sheet or plate. It has, however, in all cases, proved advantageous to make up the substrates from individual elements that have the same dimensions as the desired product, for example, solar cells having a length of 100 mm and a width of 100 mm. Numerous other variations in shape and size are, however, also possible.

Particularly good results can be achieved if the movement of the substrate past the meniscus is in an upward direction and deviates from the vertical by from 0° to 60°, preferably from 0° to 20°. If the distance between the individual elements is small, for example $\leq 0.05$ mm, a sheet is obtained that is not sub-divided, and which can then be divided into the desired individual pieces by suitable process steps, for example, sawing or scribing and then breaking up. If, however, there is a large distance between the individual elements, for example from 0.5 to approximately 2 mm, sheets are obtained that are already separated into pieces corresponding to the size of the individual elements, and thus the dividing step described above is unnecessary.

One factor that is important for achieving a coarsely crystalline to monocrystalline growth and the automatic release of the sheet from the substrate is the temperature of the substrate. If the temperature is too low, the growing sheet contains many microcrystalline areas unfavorable for solar cell base material. If the temperature of the substrate is too high, the sheet will grow in the manner of liquid epitaxy; automatic release of the sheet from the substrate will therefore no longer be possible. A temperature difference between the melt and the substrate of approximately from 0.2 to 0.5 $T_M$, preferably of approximately from 0.3 to 0.4 $T_M$, has proved particularly suitable for carrying out the process according to the invention; for silicon, for example, the temperature difference may be approximately from 350 to 850 K, preferably from 500 to 680 K, with $T_M$, the melting temperature of the silicon, having a value of 1693 K. The substrate is advantageously adjusted to the desired temperature in a temperature-adjusting tunnel that can be controlled separately.

An important factor in carrying out the process according to the invention is the pulling speed at which the substrate is moved past the position of contact with the molten semiconductor material. For reasons of effectiveness alone, the highest possible values are desired. Thus, when using silicon in the process according to the invention, speeds of over 300 mm/s have already been reached. In general, for example, it is possible to promote an increase in the pulling speed by increasing the temperature difference between the substrate and the melt, but there is the limitation that, above certain limit values, the crystal structure is no longer transferred satisfactorily from the substrate to the sheet.

In addition to the temperature and the pulling speed, the type of surface of the substrate also plays a part in the process according to the invention. As a rule of thumb, it may be stated that a low degree of surface roughness facilitates the automatic release of the sheet which has grown.

Other objects and features of the present invention will become apparent from the following detailed description considered in connection with the accompanying drawings, which disclose several embodiments of the invention. It is to be understood that the drawings are to be used for the purpose of illustration only, and not as a definition of the limits of the invention.

In the drawings, wherein similar reference characters denote similar elements throughout the several views.

Figure 1:
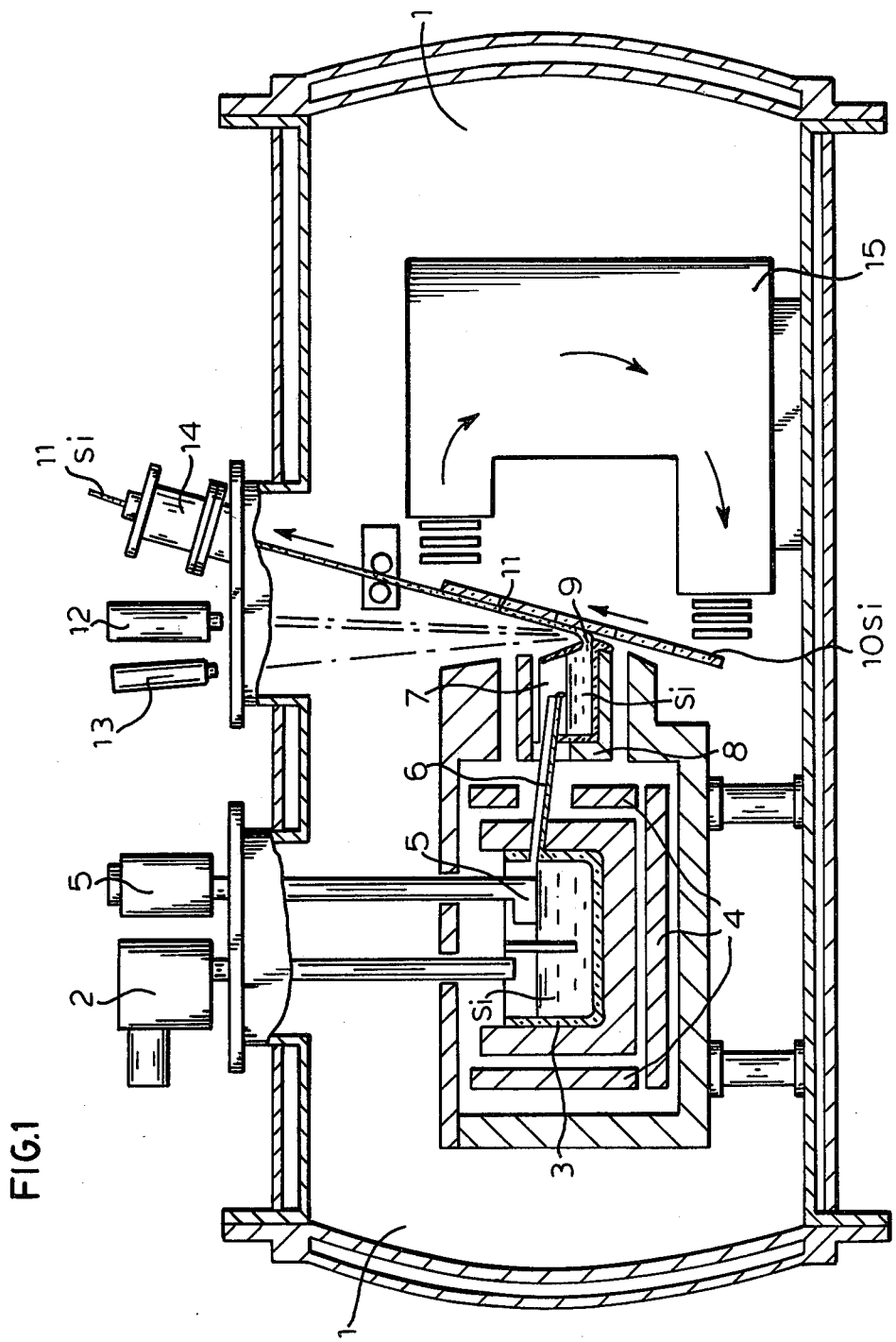
FIG. 1 is a schematic longitudinal sectional view through an apparatus for performing the present invention in which the sheet is pulled on substrates that are guided in the contact area as an "endless band".

Referring now in detail to the drawings, and in particular FIG. 1, a container 1 is shown which is made, for example, of refined steel, and which is advantageously double-walled in order to accommodate a cooling medium, such as, for example, water. The container 1 can be supplied, for example, with silicon granulate, by means of a refilling device 2.

Inside container 1, there is arranged a melt-preparation crucible 3 inside a heating apparatus 4. This crucible is used as a supply vessel; its molten contents can be transferred, for example with the aid of one or more displacement bodies 5, via an overflow system 6, into a pulling crucible 7. Instead of using displacement bodies as shown, the overflow of the melt can also take place, for example, by means of a capillary body or, if a closed melt-preparation crucible that has an outlet aperture leading into the pulling crucible is used, by forcing the melt over by means of gas pressure.

The pulling crucible, heated by the crucible-pulling heating system 8 by irradiation, induction or resistance heating has, at its front end, a slot-like aperture 9 from which the molten semiconductor material can be discharged to form a meniscus stabilized by surface tension. The meniscus is brought into contact with the substrate 10 which consists, for example, of a row of individual plates and which moves past the meniscus in an upward direction, a sheet 11 being applied to the substrate as a thin layer. The free surface of the melt film of the sheet 11, which film is pulled off at the contact position, can be maintained at the desired temperature by means of the supplementary heating system 12, preferably by means of radiant heating, e.g., laser irradiation. The formation of the meniscus before contact, and the formation of the free surface of the melt film pulled off at the contact position, which takes place during the application operation, can be monitored, for example by an optical control device 13. The beginning and end of the application operation can be particularly advantageously controlled if the pulling crucible can be tilted, thus making it possible to interrupt or bring about contact between the melt and the substrate in a simple manner.

As early as a few seconds after complete crystallization, the connection between the sheet and the substrate, which is firm at the moment of application, begins to loosen. The sheet leaves the container through the outlet valve 14 and can be further processed, e.g., by sawing, into individual plates while the substrate is returned for reuse and is readjusted to the desired temperature in the temperature adjusting tunnel 15. An inert gas atmosphere of, e.g., nitrogen, carbon dioxide, noble gases or mixtures of different inert gases may be maintained in the container; operation in a vacuum is, however, also possible.

Figure 2:
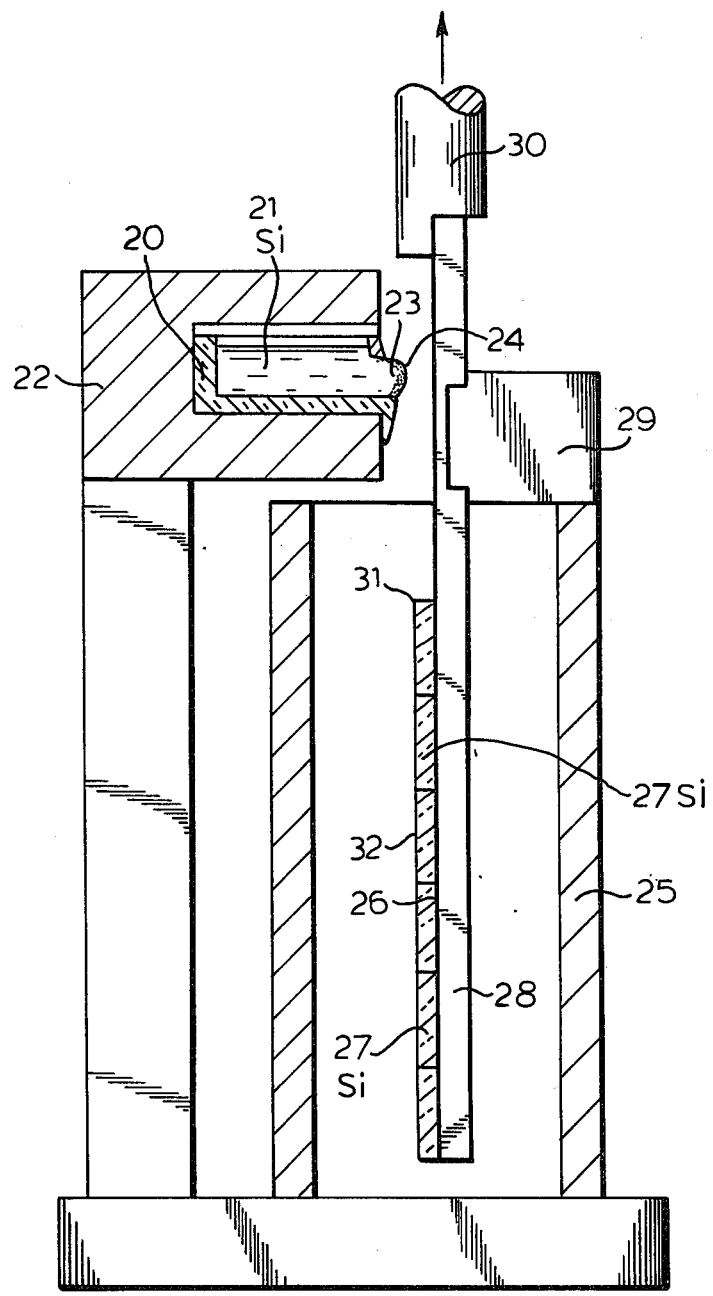
FIG. 2 is a schematic longitudinal sectional view through an apparatus for performing an alternate embodiment of the process of the present invention where the sheet is pulled on a ramp.

According to FIG. 2, the sheet can alternatively be pulled on a substrate designed as a ramp. For the sake of clarity, FIG. 2 does not show the container, the melt-preparation device or the melt-transfer system, since they can be designed, for example, as in the arrangement described in FIG. 1.

A pulling crucible 20, which is preferably of quartz, contains the melt 21 of semiconductor material, maintained at a temperature of at least 5° C. above the melting temperature by means of a heating device 22, for example a graphite melt heater. At the front end of the pulling crucible, a slot-like aperture 23 is provided, from which a meniscus 24 of the molten semiconductor material stabilized by surface tension projects by at least 0.5 mm.

In a separately controllable temperature-adjusting tunnel 25, a substrate in the form of a movable ramp 26 is maintained at a temperature set within a range of from 0.5 to 0.8 $T_M$, i.e., in the case of silicon, e.g., within a temperature range of from 850 to 1350 K, preferably from 1000 to 1200 K (values rounded off). The ramp consists of coarsely crystalline to monocrystalline structural members 27 of the same semiconductor material as that contained in molten form in the pulling crucible. Those structural members are advantageously mounted on a slide 28 of suitable carrier material, for example graphite. By means of a guide means 29 and a lifting device 30, the slide can be moved out of the temperature-adjusting tunnel and past the pulling crucible in an upward direction at an accurately maintained distance from the front end of the pulling crucible. As this is done, first the ramp edge 31, and then the ramp surface 32, comes into contact with the meniscus of the semiconductor material and they are covered with a sheet that is coarsely crystalline to monocrystalline depending on the ramp material and that, even only shortly after solidifying, adheres only weakly to the ramp and can be readily removed, e.g., by means of suitable gripping devices, and further processed to form solar cell material.

If the distance between the individual structural members that make up the ramp is sufficiently large, there is obtained, not a continuous sheet, but pieces of sheet that have already become separated from one another, for example, plates having the dimensions of the structural members. The choice of the ramp temperature and the speed at which the ramp is moved can, in a simple manner, also determine the thickness of the sheet obtained, so that it is possible, in a single operation, to manufacture pieces of semiconductor material having the desired width, length and thickness.

By using a series of ramps arranged, for example, in the form of a circle or an endless band, which are moved in succession past the meniscus, this process can advantageously also be carried out continuously, since the ramps can be reused as often as desired.

Thus, the process according to the invention, provides an efficient method of manufacturing semiconductor material for inexpensive solar cell base material.

The invention will now be described by several examples which are given by way of illustration and not of limitation.

EXAMPLE 1

Using an apparatus as shown in FIG. 1, silicon is continuously melted in a melt-preparation crucible, which is a partitioned crucible, and the silicon is continuously supplemented, at a rate of approximately 21 g/s, in the form of a granulate having a grain size of from 1 to 5 mm. Instead of being in granular form, the silicon can also be introduced into the melt-preparation crucible by direct melting of a polysilicon rod or, alternatively, it can be introduced directly into the pulling crucible if the quantity melted is suitably controlled.

The melt, which is maintained at 1430° C. in the melt preparation crucible, is transferred into pulling crucible by displacement bodies in accordance with the quantity of silicon subsequently added, and is there adjusted to a melt level of approximately 11 mm in the case of a horizontal crucible position. The pulling crucible has a slot-like aperture 6 mm high and 110 mm wide through which the molten silicon passes, forming a meniscus stabilized by surface tension. The temperature at the overhanging meniscus, which measures approximately 1 mm, is maintained at 1430° C. by laser heating.

The substrate used in the process according to the invention consists of ninety 10 mm-thick monocrystalline silicon plates of preferred orientation and each measuring 100×100 mm and having a surface roughness depth of approximately from 1 to 2 μm. The plates are circulated in such a manner that, from a position approximately 250 mm upstream of the melt/substrate contact position and for a distance of 500 mm, they xove in an upward direction past the pulling crucible at a distance of 0.5 mm therefrom, in the manner of an "endless band" and at a speed of 300 mm/s. During this operation, the direction of the "endless band" deviates by approximately 20° from the vertical; the distance of the plates from one another is ≦0.05 mm. After passing through this guide area, the silicon plates are slowed to a speed of approximately 35 mm/s, they pass through a temperature-adjusting tunnel, where they are adjusted to a temperature of 680° C., and finally they return to the area where they are guided as an "endless band".

The silicon sheet is applied to the moving substrate by bringing the latter into contact with the meniscus of the molten silicon by tilting the pulling crucible through approximately 2°. The sheet applied in this manner detaches itself unaided from the substrate immediately after cooling to the temperature of the substrate. The substrate is returned to the temperature-adjusting tunnel and is there adjusted to a temperature of 680° C. The detached 0.3 mm thick sheet is guided out of the container, which has been evacuated to approximately 10⁻mbar, through the vacuum valve and is divided up by laser scribing into monocrystalline plates 100 mm long and 100 mm wide, which have the preferred orientation of the substrate.

EXAMPLE 2

Using an apparatus as shown in FIG. 2, 85 g of silicon were melted and gradually transferred into the pulling crucible where the melt was adjusted to a temperature of 1450° C. The pulling crucible had a slot-like aperture 5 mm high and 60 mm wide through which a meniscus of molten silicon overhung by 2 mm. The temperature at the overhanging meniscus, measured by means of a radiation pyrometer, was 1450° C.

The substrate that was used in the process according to the invention, and which was in the form of a ramp, consisted of ten 50×50 mm 8 mm-thick plates of coarsely crystalline silicon having an average crystallite size of from 5 to 10 mm, the surface having a roughness depth of approximately 2 μm. The distance of the plates from one another was 0.04 mm; the plates were secured to a slide of graphite. The entire ramp was first maintained at a temperature of 900° C. in a resistance-heated temperature-adjusting tunnel.

Then, by means of a lifting device and with accurate guiding, the ramp was moved vertically upwards at a speed of 80 mm/s past, and at a distance of 1 mm from, the meniscus which had been discharged from the slot-like aperture of the pulling crucible. Beginning with the first contact between the ramp and the meniscus, the silicon plates making up the ramp were covered with a, at first liquid, but rapidly solidifying, silicon sheet. This sheet began to become detached as early as during the cooling from melt temperature to ramp temperature. Finally, held by adhesion forces, the sheet rested on the ramp and could be removed from the support. The resulting sheet was 500 mm long, 50 mm wide and 0.3 mm thick. It had the same coarsely crystalline structure as that of the silicon plates used as substrate. After removing the sheet, it was possible to use the ramp again for the sheet-pulling process. Throughout the entire process, an argon atmosphere was maintained in the container, at a pressure of 10 mbar.

EXAMPLE 3

In this example, the procedure was as indicated in Example 2, except that the ramp used consisted of ten 8 mm-thick monocrystalline silicon plates measuring 50×50 mm which were mounted at a distance of 0.8 mm from one another on a graphite slide corresponding to that used in Example 2. In this case, it was possible to obtain, by the pulling process, ten separate, almost completely monocrystalline, silicon plates having a preferred orientation and a length of 50 mm, a width of 50 mm and a thickness of 0.3 mm.

EXAMPLE 4

In the apparatus shown in FIG. 2, 120 g of germanium are melted and gradually transferred into the pulling crucible having a slot-like aperture 3 mm high and 60 mm wide. The melt is maintained at 950° C. and forms a meniscus having an overhang of approximately 1 mm.

The ramp used consists of six 50×50 mm, 4 mm-thick plates of monocrystalline germanium having a roughness depth of approximately 2 μm. The plates are secured to a slide of graphite, at a distance of 0.04 mm from one another. The entire ramp is first maintained at 575° C. in a resistance-heated temperature-adjusting tunnel.

The ramp is then moved at a speed of 120 mm/s past the pulling crucible and at a distance of 0.5 mm therefrom, according to the process described in Example 2, and a germanium sheet is pulled off and finally removed from the support, which can be reused.

The resulting monocrystalline germanium sheet of preferred orientation is 300 mm long, 50 mm wide and 0.25 mm thick. Throughout the entire process, an argon atmosphere is maintained in the container at a pressure of 10 mbar.

While only several embodiments and examples have been shown and described, it will be obvious that many changes and modifications may be made thereunto, without departing from the spirit and scope of the invention.

What is claimed is:

1. In a process for the manufacture of coarsely crystalline to monocrystalline sheets of semi-conductor material of preferred orientation by applying molten semiconductor material to a substrate with subsequent controlled solidification and subsequent automatic release of the applied semiconductor material, the improvement comprising the steps of:
    bringing molten semiconductor material into contact with a substrate of the same semiconductor material having the desired coarsely crystalline to monocrystalline structure, said substrate being guided past the point of contact at a speed of at least 75 mm/s; and
    maintaining the substrate at a temperature of not more than 0.8 $T_M$, where $T_M$ denotes the melting point of the semiconductor material expressed in degress Kelvin, so as to ensure the automatic release of the growing sheet.

2. The process of claim 1, wherein said molten semiconductor material and the substrate are brought into contact with one another by means of a melt meniscus.

3. The process of claim 2, wherein said meniscus of said molten semiconductor material is produced with the aid of a slot-like aperture.

4. The process of claim 1, wherein said melt of semiconductor material is maintained at a temperature of at least 5° C. above its melting point.

5. The process of claim 1, additionally including the step of regulating the thickness of the sheet of semiconductor material by appropriate adjustment of the speed of the substrate.

6. The process of claim 1, wherein silicon is used as said semiconductor material.

* * * * *